United States Patent
D'Ambrosio et al.

(10) Patent No.: US 7,995,365 B1
(45) Date of Patent: Aug. 9, 2011

(54) METHOD AND APPARATUSES FOR MANAGING DOUBLE DATA RATE IN NON-VOLATILE MEMORY

(75) Inventors: Elio D'Ambrosio, Avezzano (IT); Ciro Chiacchio, Casoria (IT); Dionisio Minopoli, Arzano (IT)

(73) Assignee: Micron Technology, Inc., Boise, ID (US)

( * ) Notice: Subject to any disclaimer, the term of this patent is extended or adjusted under 35 U.S.C. 154(b) by 197 days.

(21) Appl. No.: 12/434,600

(22) Filed: May 1, 2009

(51) Int. Cl.
G11C 5/00 (2006.01)
G11C 7/00 (2006.01)

(52) U.S. Cl. ............... 365/52; 365/189.02; 365/189.05; 365/230.06; 365/233.1; 365/233.13; 365/240

(58) Field of Classification Search ............... 365/52, 365/189.02, 189.05, 230.06, 233.1, 233.13, 365/240
See application file for complete search history.

(56) References Cited

U.S. PATENT DOCUMENTS

| | | | |
|---|---|---|---|
| 6,212,113 B1 * | 4/2001 | Maeda .................. | 365/233.13 |
| 6,549,484 B2 * | 4/2003 | Morita et al. ............ | 365/233.1 |
| 6,556,486 B2 * | 4/2003 | Benzinger et al. ....... | 365/189.05 |
| 6,603,706 B1 * | 8/2003 | Nystuen et al. .......... | 365/233.1 |
| 6,674,686 B2 * | 1/2004 | Noh et al. ............... | 365/233.13 |
| 6,717,832 B2 * | 4/2004 | Johnson et al. ......... | 365/52 |
| 6,972,981 B2 * | 12/2005 | Ruckerbauer et al. ... | 365/52 |
| 7,046,580 B1 * | 5/2006 | Manapat et al. ........ | 365/233.13 |
| 7,054,222 B2 * | 5/2006 | Li et al. ................. | 365/240 |
| 7,113,417 B2 * | 9/2006 | Pochmuller ............. | 365/52 |
| 7,221,617 B2 * | 5/2007 | Flach et al. ............. | 365/233.13 |
| 7,227,812 B2 * | 6/2007 | Li et al. .................. | 365/233.1 |
| 7,272,054 B2 * | 9/2007 | Waldrop .................. | 365/233.1 |
| 7,558,151 B1 * | 7/2009 | Svoiski ................... | 365/233.13 |
| 7,688,672 B2 * | 3/2010 | Best et al. ............... | 365/233.1 |

OTHER PUBLICATIONS

Hynix Semiconductor, Intel Corporation, Micron Technology, Inc., Phison Electronics Corp., Sony Corporation, Spansion, STMicroelectronics,"Open NAND Flash Interface Specification", Revision 2.0, Feb. 27, 2008, pp. 174 total.

Wikipedia, the free encyclopedia, "DDR SDRAM", http://en.wikipedia.org/wiki/DDR_SDRAM, Modified on Dec. 13, 2008, printed on Dec. 15, 2008, pp. 5 total.

JEDEC Electronic Industires Alliance (EIA), "JEDEC Standard, Low Power Double Data Rate (LPDDR) Non-Volatile Memory (NVM) Specification", JESDxxx, Jan. 2007, JEDEC Solid State Technology Association, pp. 70, plus 2 pages for Preliminary publication of JEDEC Semiconductor Memory Ballot, Ballot No. JCB-07-016, Date of Council Approval, Feb. 2007, pp. 72 total.

(Continued)

*Primary Examiner* — Trong Phan
(74) *Attorney, Agent, or Firm* — Blakely, Sokoloff, Taylor & Zafman LLP

(57) ABSTRACT

Described herein are a method and apparatuses for providing DDR memory access. In one embodiment, an apparatus includes a data storage unit to store and synchronize a plurality of data line signals with a clock signal. The apparatus includes a selector unit that receives the plurality of data line signals and selects two data line signals. The apparatus also includes a double data rate (DDR) output unit that receives the two data line signals from the selector unit and generates a DDR data line signal having a time period substantially one half of a clock time period of the clock signal. The apparatus also includes an input/output (I/O) pad coupled to and locally positioned with respect to the DDR output unit. The data storage unit, the selector unit, and the DDR output unit in combination form an I/O buffer which is locally coupled to the I/O pad.

19 Claims, 17 Drawing Sheets

OTHER PUBLICATIONS

IEEE Std 802.11-2007, "IEEE Standard for Information Technology—Telecommunications and information exchange between systems—Local and metropolitan area networks—Specific requirements", Jun. 12, 2007, pp. 1,233 total.

IEEE Std 802.16.2, "IEEE Recommended Practice for Local and metropolitan area network—Coexistence of Fixed Broadband Wireless Access Systems", IEEE Computer Society and the IEEE Microwave Theory and Techniques Society, Sponsored by the LANMAN Standards Committee, Mar. 17, 2004, pp. 171 total.

* cited by examiner

US 7,995,365 B1

METHOD AND APPARATUSES FOR MANAGING DOUBLE DATA RATE IN NON-VOLATILE MEMORY

BACKGROUND

1. Field of the Invention

Embodiments of the present invention relate generally to the field of accessing non-volatile memory. More particularly, embodiments of the present invention relate to accessing non-volatile memory with double data rate (DDR).

2. Description of the Related Art

Electronic devices may require high speed access to non-volatile memory contained within these devices. A prior global approach for DDR non-volatile memory access in an electronic device requires dividing the memory into memory blocks. Each of the memory blocks sends data signals to a global data synchronization register (DSR), which provides an interface between a 32-bit internal data bus and 8-bit I/O pads. Prior to data output, all 8-bytes from the memory via the internal data bus are preloaded to the global DSR which synchronizes the data signals with a clocking signal for the first data access. Data is globally sent from the global DSR to a global output buffer and then various I/O pads.

This global approach suffers from global parasitic interconnect delays between the memory blocks, global DSR, and global output buffer. Accessing various memory blocks may be more complicated and slower than accessing a single memory block.

BRIEF DESCRIPTION OF THE DRAWINGS

One or more embodiments of the present invention are illustrated by way of example and not limitation in the figures of the accompanying drawings, in which like references indicate similar elements and in which.

Figure 1:
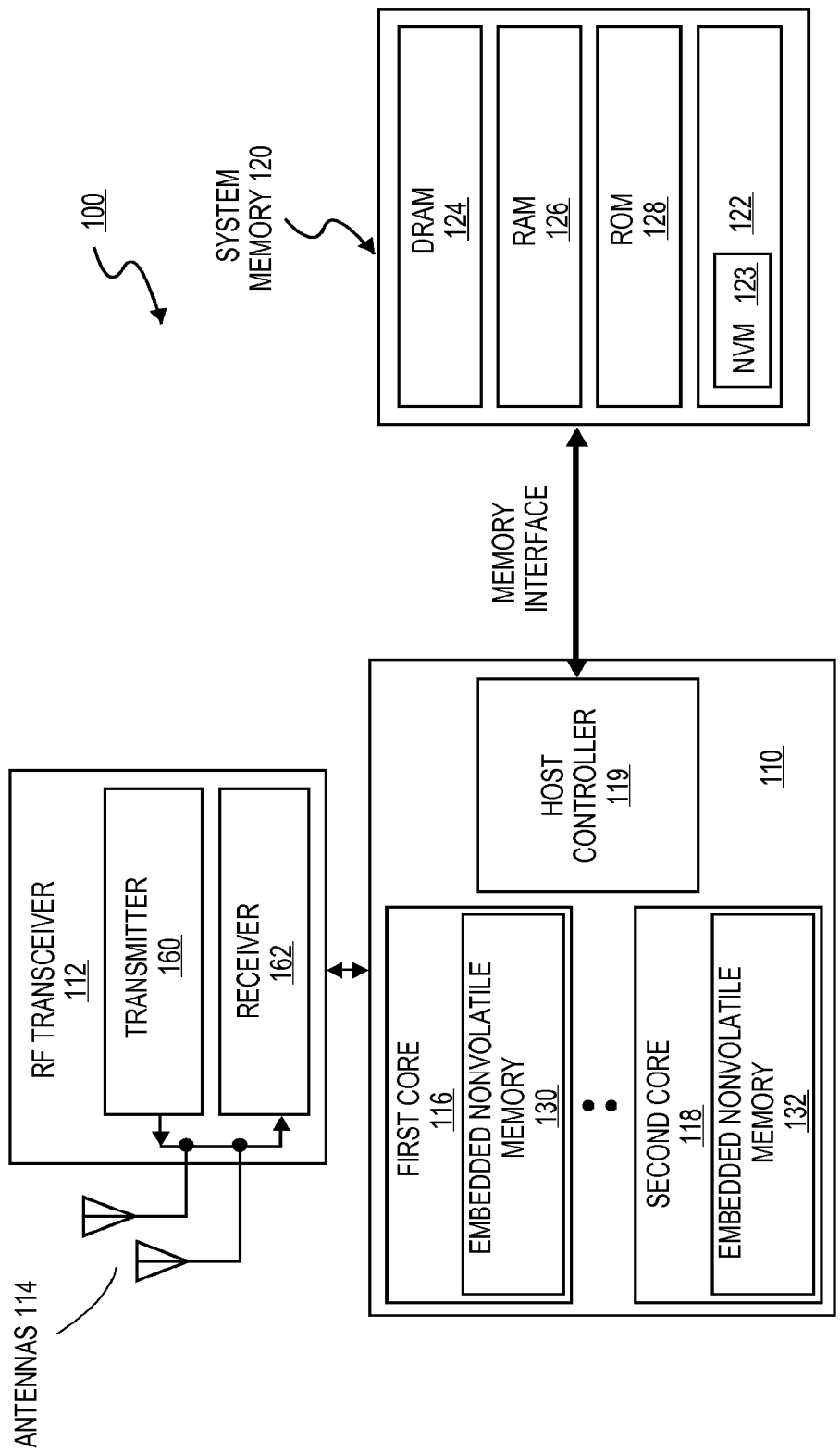
FIG. 1 illustrates a data processing device in accordance with one embodiment.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

Described herein are a method and apparatuses for providing DDR memory access. In one embodiment, an apparatus includes a data storage unit to store and synchronize a plurality of data line signals with a clock signal. The apparatus includes a selector unit that receives the plurality of data line signals and selects two data line signals. The apparatus also includes a double data rate (DDR) output unit that receives the two data line signals from the selector unit and generates a DDR data line signal having a time period substantially one half of a clock time period of the clock signal. The apparatus also includes an input/output (I/O) pad coupled to and locally positioned with respect to the DDR output unit. The data storage unit, the selector unit, and the DDR output unit in combination form an I/O buffer which is locally coupled to or enclosed within the I/O pad. The I/O buffer provides the synchronization of the DDR data line signal with the clocking signal while being locally positioned with respect to the I/O pad. Memory is coupled to the I/O buffer.

The implementation of the DDR output unit in the I/O buffer, which is locally positioned with respect to I/O pads, reduces and minimizes parasitic interconnect delays and allows easier synchronization between the clock signal and the data signal. Also, the DDR is implemented merely at a last data-pipeline stage at an output buffer level rather than earlier in the data-pipeline from the memory to the I/O pads.

FIG. 1 illustrates a data processing device with DDR non-volatile memory access in accordance with one embodiment. The data processing device 100 includes a processing unit 110 having first and second processor cores 116 and 118, a host controller 119, and a system memory 120 coupled to the processing unit 110. The host controller 119 can be internal to the processing unit 110 or external to the processing unit 110. The first and second processing cores 116 and 118 include embedded non-volatile memory 130 and 132, respectively. The system memory 120 includes a circuit device 122, which may be an integrated circuit device 122, and various types of memory (e.g., DRAM 124, RAM 126, ROM 128). The integrated circuit device 122 provides DDR non-volatile memory access. The integrated circuit device 122 will be discussed in more detail in conjunction with FIG. 3.

The data processing device 100 may optionally include a transceiver 112 coupled to the processing unit 110. The transceiver 112 receives over-the-air signals with antennas 114 and includes a transmitter 160 and a receiver 162. As shown in this wireless embodiment, data processing device 100 includes one or more antenna structures 114 to allow radios to communicate with other over-the-air data processing devices. As such, data processing device 100 may operate as a cellular device or a device that operates in wireless networks such as, for example, Wireless Fidelity (Wi-Fi) that provides the underlying technology of Wireless Local Area Network (WLAN) based on the IEEE 802.11 specifications, WiMax and Mobile WiMax based on IEEE 802.16-2005, Wideband Code Division Multiple Access (WCDMA), and Global System for Mobile Communications (GSM) networks, although the present invention is not limited to operate in only these networks. The radio subsystems collocated in the same platform of device 100 provide the capability of communicating with different frequency bands in an RF/location space with other devices in a network. It should be understood that the scope of the present invention is not limited by the types of, the number of, or the frequency of the communication protocols that may be used by data processing device 100.

The embodiment illustrates the coupling of antenna structure 114 to a transceiver 112 to accommodate modulation/demodulation. In general, analog front end transceiver 112 may be a stand-alone Radio Frequency (RF) discrete or integrated analog circuit, or transceiver 112 may be embedded with a processor having one or more processor cores 116 and 118. The multiple cores allow processing workloads to be shared across the cores and handle baseband functions and application functions. An interface may be used to provide communication or information between the processor and the memory storage in a system memory 120. Although the scope of the present invention is not limited in this respect, the interface may comprise serial and/or parallel buses to share information along with control signal lines to be used to provide handshaking between the processor and system memory 120.

The system memory 120 may optionally be used to store instructions that are executed by the processor during the operation of wireless data processing device 100, and may be used to store user data such as the conditions for when a message is to be transmitted by wireless data processing device 100 or the actual data to be transmitted. For example, the instructions stored in system memory 120 may be used to perform wireless communications, provide security functionality for data processing device 300, user functionality such as calendaring, email, internet browsing, etc.

System memory 120 may be provided by one or more different types of memory and may include both optional DRAM 124, RAM 126, and/or ROM 128 and the integrated circuit device 122 having non-volatile memory (NVM) 123. The NVM 123 may include a phase change material. NVM 123 may be referred to as a Phase Change Memory (PCM), Phase-Change Random Access Memory (PRAM or PCRAM), Ovonic Unified Memory (OUM) or Chalcogenide Random Access Memory (C-RAM). NVM 123 may include flash memory (e.g., NOR, NAND), solid state drive, and card/stick memory.

The volatile and nonvolatile memories may be combined in a stacking process to reduce the footprint on a board, packaged separately, or placed in a multi-chip package with the memory component placed on top of the processor. The embodiment also illustrates that one or more of the processor cores may be embedded with nonvolatile memory 130 and 132.

Figure 2:
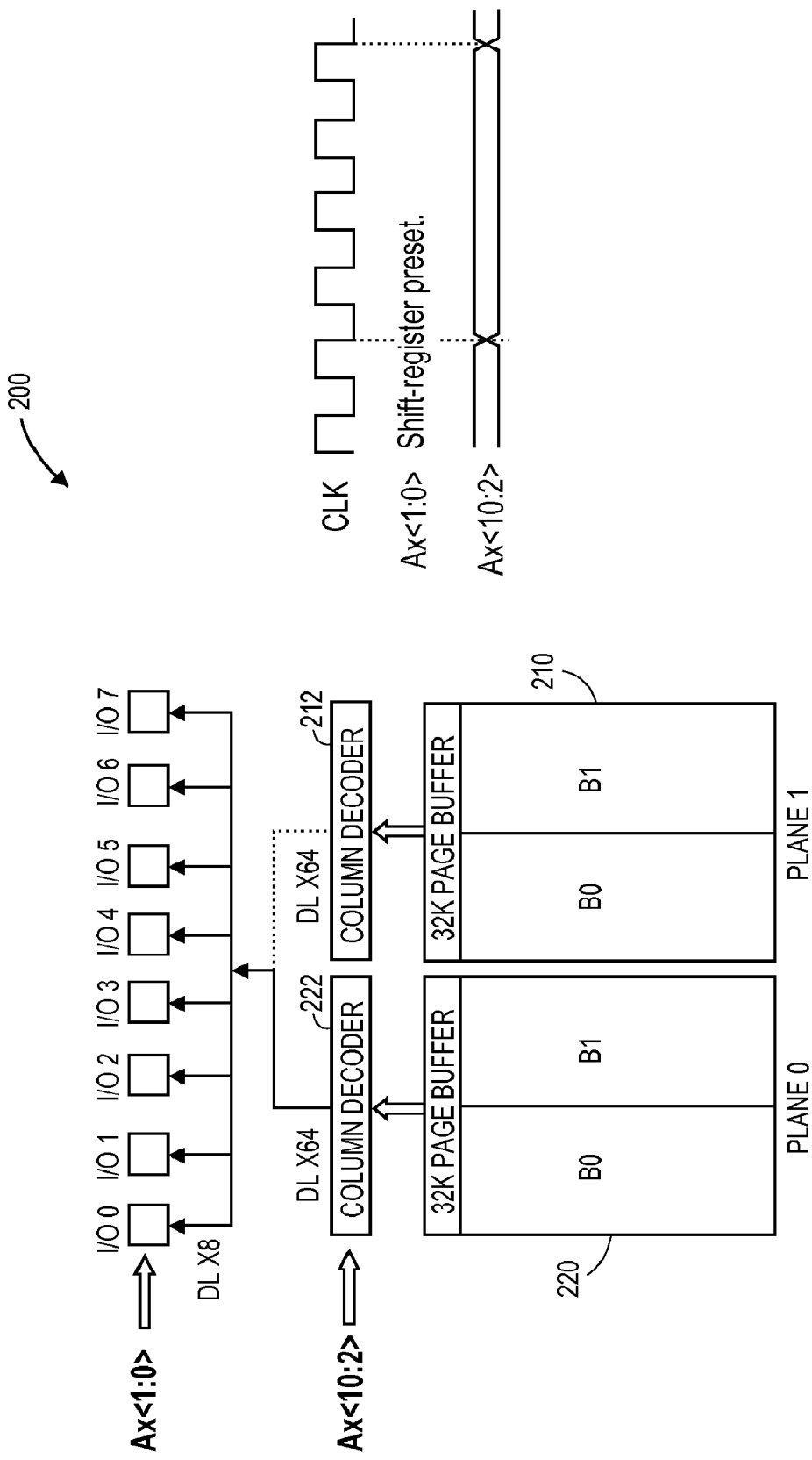
FIG. 2 illustrates an apparatus that provides DDR memory access in accordance with one embodiment.

FIG. 2 illustrates an apparatus that provides DDR memory access in accordance with one embodiment. The apparatus 200 includes non-volatile memory buffers 210 and 220 (e.g., 32K page buffers in a plane 0 with B0 and B1 and a plane 1 with B0 and B1), column decoders 222 and 212, data line signals in groups of 64 (DL ×64) and groups of 8 (DL ×8), and input/output (I/O) structures 0-7. A clock signal and address select signals (e.g., Ax<1:0>(shift-register preset), Ax<10:2>) are also illustrated in FIG. 2. The apparatus 200 may be an integrated circuit device 122.

Figure 3:
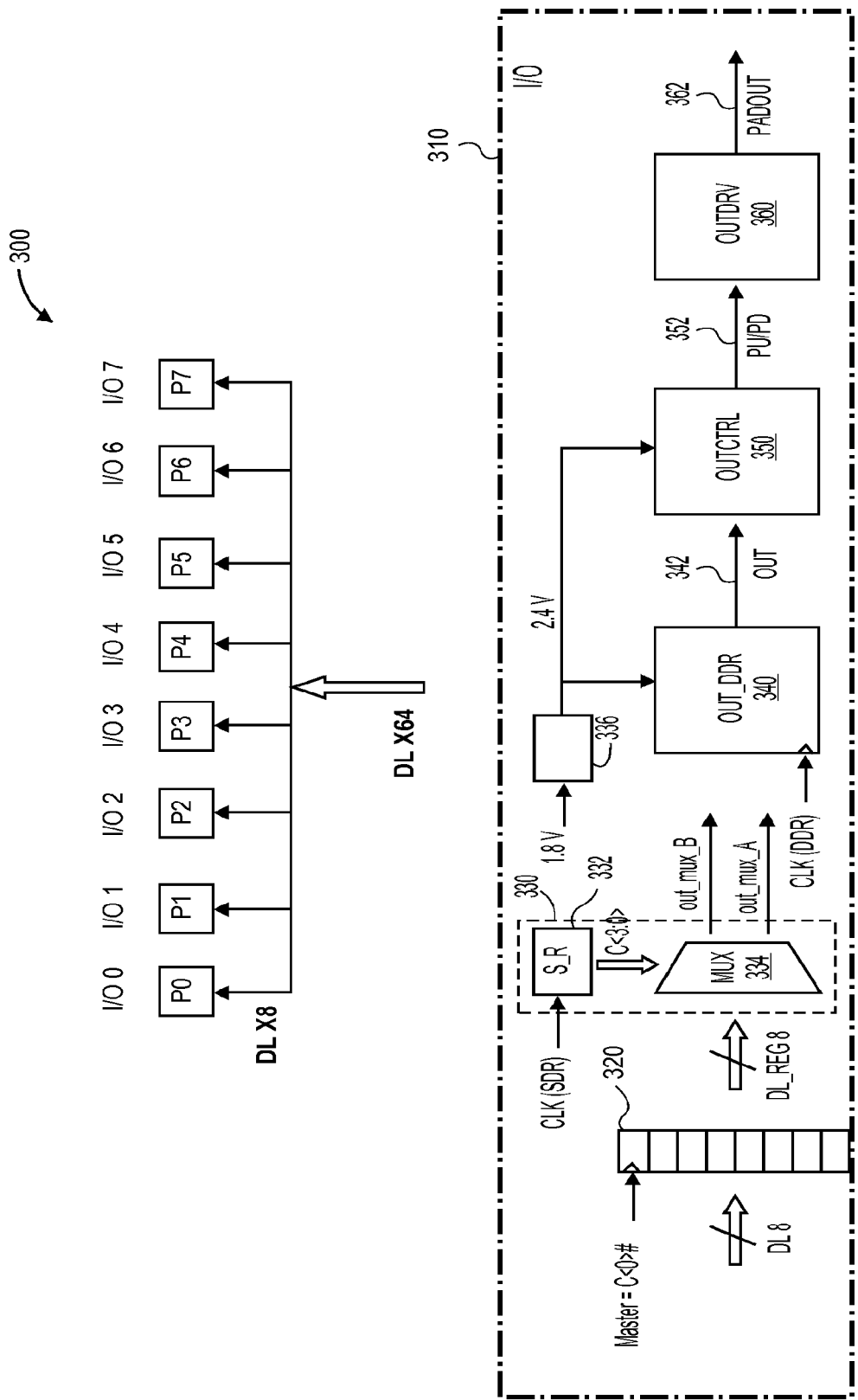
FIG. 3 illustrates an apparatus that provides DDR memory access in accordance with another embodiment.

FIG. 3 illustrates an apparatus that provides DDR memory access in accordance with another embodiment. The apparatus 300, which may be an integrated circuit 122, includes data line signals in groups of 64 (DL ×64) and groups of 8 (e.g., DL ×8, DL 8, DL REG 8), and input/output (I/O) structures 0-7. Each I/O structure includes by enclosing or is locally coupled to an I/O buffer 310 and includes I/O pads P0-P7. The I/O buffer 310 includes a data storage unit 320 (e.g., master-slave register) to store and synchronize a plurality of data line signals with a master clock signal (e.g., C<0>#) having a time period 4T in one embodiment. A selector unit 330 is coupled to the data storage unit 320. The selector unit 330 receives the plurality of data line signals and selects two data line signals (e.g., out_mux_B, out_mux_A) using a clock signal with a time period T. The select unit 330 may include a shift register (S R) 332 and a multiplexer 334. Address select lines (e.g., 0<3:0>) are used to select data line signals from the multiplexer 334. The shift register receives a single data rate (SDR) clock signal with a time period T. The select unit 330 may include other types of hardware components for selecting two of the data line signals.

The I/O buffer 310 also includes a double data rate (DDR) output unit 340 that receives the two data line signals from the selector unit 330 and generates a DDR data line signal 342 having a time period substantially one half, T/2, of a clock time period T of the clock signal (CLK(DDR)). The I/O buffer 310 further includes an output control unit 350 that is coupled to the DDR output unit 340. The output control unit 350 receives the DDR data line signal 342 and generates output control signals 352. The I/O buffer 310 further includes an output drive unit 360 that is coupled to the output control unit 350. The output drive unit 360 receives the output control signals 352 (e.g., PU, PD) and generates output signals 362 (e.g., PADOUT) that are sent to one of the I/O pads.

The I/O buffer 310 further includes a voltage multiplier unit 336 that is coupled to the DDR output unit 340 and the output control unit 350. In one embodiment, the voltage multiplier unit 336 receives a first voltage supply (e.g., 1.8V) and generates a second voltage supply (e.g., 2.4V) that is greater than the first voltage supply. The higher voltage supply may be necessary because of the short time period (e.g., 6 ns) of the DDR signal 342.

Input/output (I/O) pads of the I/O structure 0-7 are coupled to and locally positioned with respect to the DDR output unit 340. The I/O buffer 310 provides the synchronization of the DDR data line signal 342 with the clocking signal while being locally positioned with respect to the I/O pad. In one embodiment, one I/O buffer 310 is enclosed within each I/O structure 0-7. The memory 210 and 220 is coupled to the I/O buffer 310.

The location of the DDR output unit 340 in the I/O buffer 310, which is locally positioned with respect to the I/O pads, reduces and minimizes parasitic interconnect delays and allows easier synchronization between the clock signal and the data line signals. Also, the DDR is implemented merely at a last data-pipeline stage rather than earlier in the data-pipeline from the memory 210 or 220 to the I/O structure 0-7. Adding the DDR implementation at the last data-pipeline stage, the I/O buffer 310, allows a longer and parasitic-safe data propagation time from the page buffers, memory 210 and 220, to the I/O pads. The memory may provide a synchronous burst-read mode at approximately greater than or equal to 200 mega transfers per second.

Figure 4:
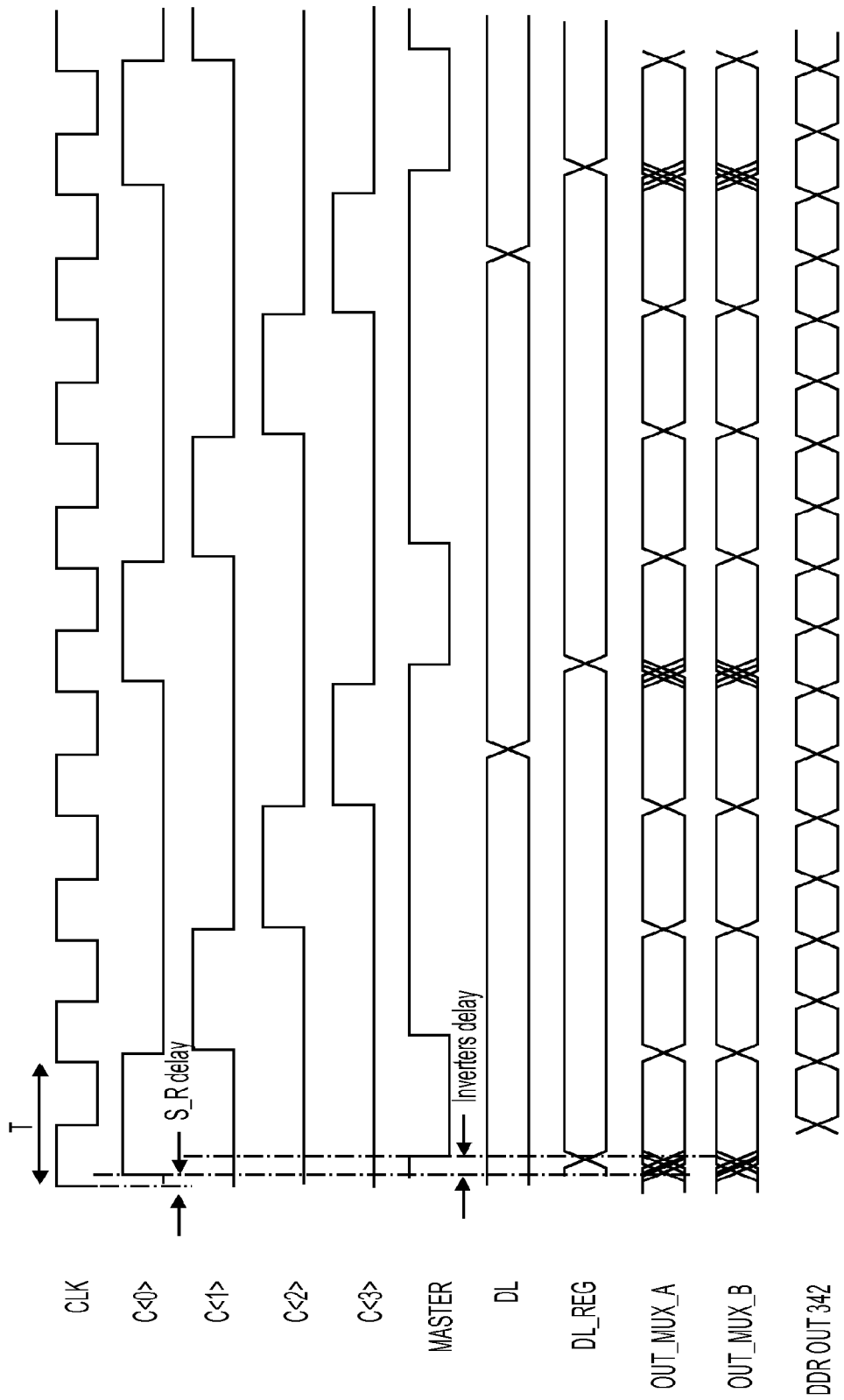
FIG. 4 illustrates timing signals for an I/O buffer in accordance with one embodiment.

FIG. 4 illustrates timing signals for an I/O buffer in accordance with one embodiment. The clock time period T may be approximately less than or equal to 12 nanoseconds and the time period T/2 of the DDR data line signal 342 may be approximately less than or equal to 6 nanoseconds. Relative timing between select lines (e.g., C<3:0>), the master clock signal (MASTER), data line signals (DL), data line signals (DL REG) output from the storage unit 320 (e.g., register), S R delay, Inverters delay, out_mux_A, and out_mux_B signals are also illustrated in FIG. 4.

Figure 5A:
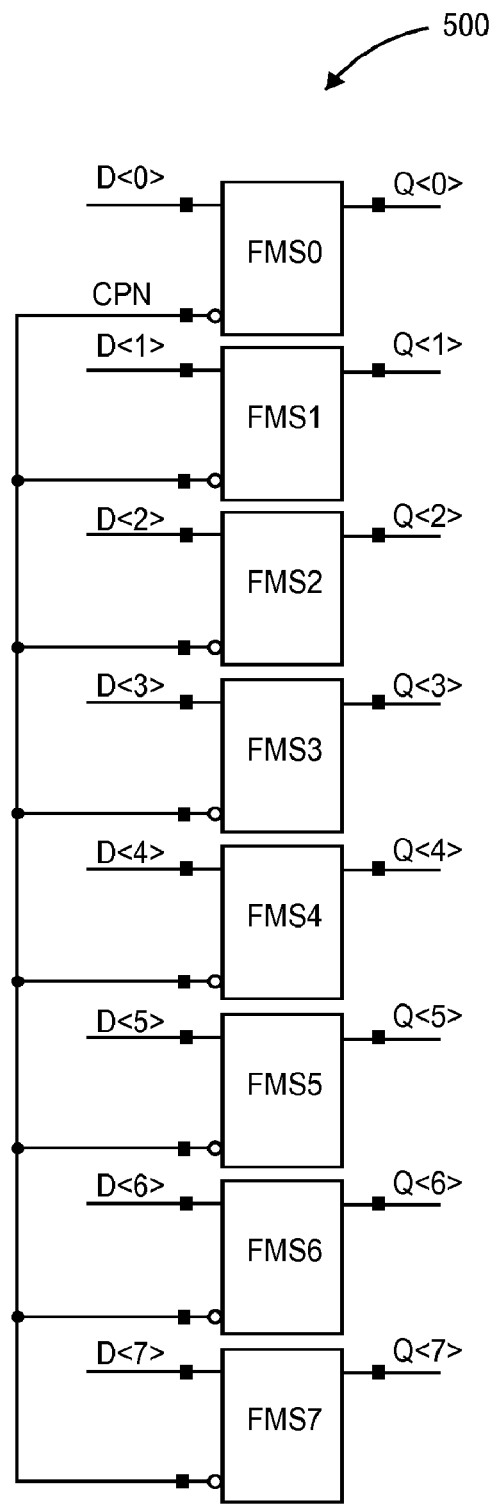
FIG. 5A illustrates a master-slave data storage unit in accordance with one embodiment.

FIG. 5A illustrates a master-slave data storage unit in accordance with one embodiment. The master-slave data storage unit 500, which may be the data storage unit 320, includes flip-flips (FMS0-7) with D input signals (e.g., D<7:0> or D<0>-D<7>), master clock signal CPN, and Q output signals Q<7:0>.

Figure 5B:
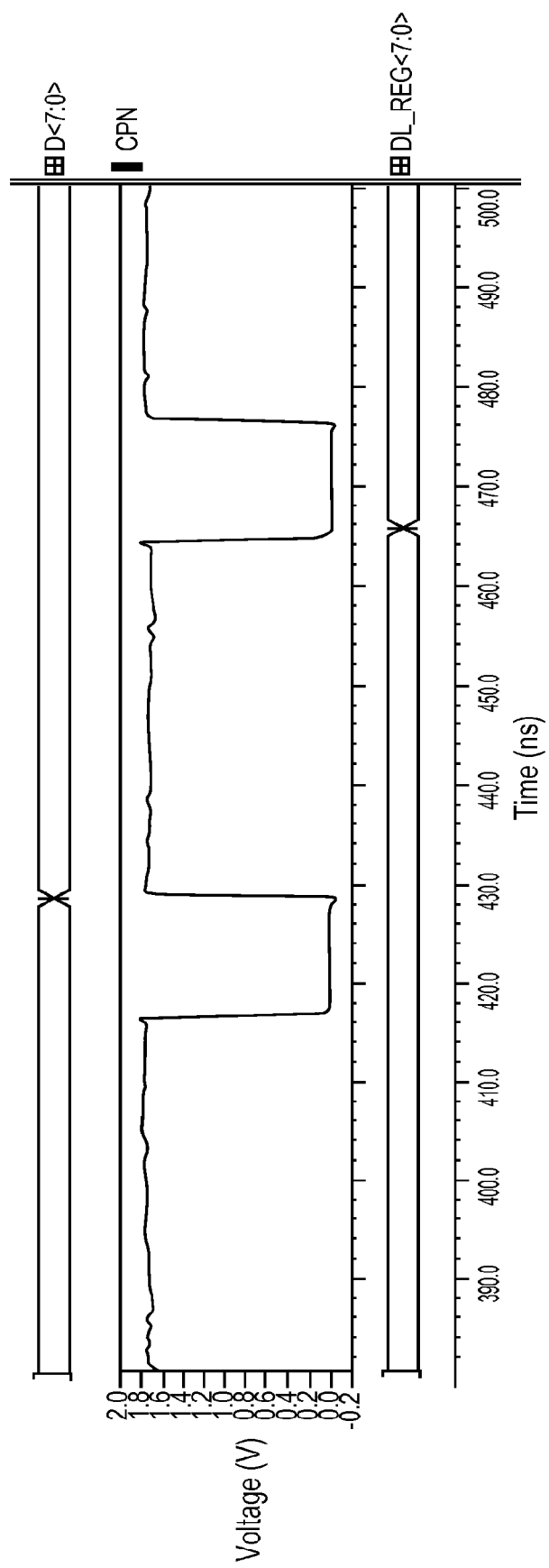
FIG. 5B illustrates timing signals for the master-slave data storage unit 500 in accordance with one embodiment.

FIG. 5B illustrates voltage versus time in nanoseconds (ns) of timing signals for the master-slave data storage unit 500 in accordance with one embodiment. The master-slave data storage unit 500 synchronizes the input data signals with the master clock signal CPN. The D<7:0> and DL_REG<7:0> or Q<7:0> represent the bus of eight data input and output signals, respectively. The time period 4T of the master clock signal may be approximately less than or equal to 48 nanoseconds in one embodiment.

Figure 6:
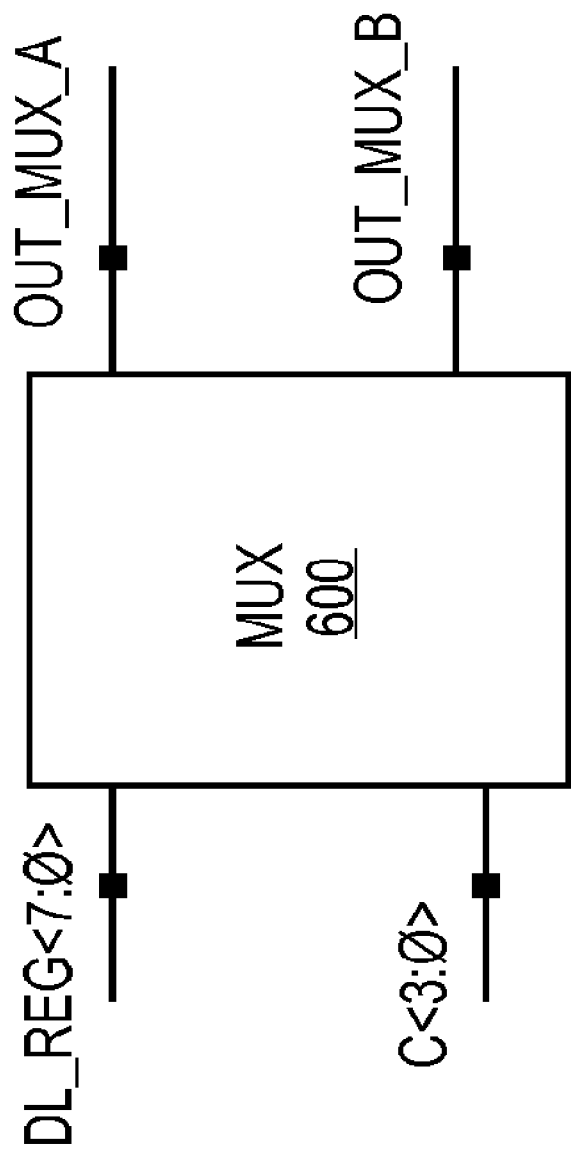
FIG. 6 illustrates a multiplexer in accordance with one embodiment.

FIG. 6 illustrates a multiplexer in accordance with one embodiment. The multiplexer 600 receives 8 data signals synchronized (e.g., DL_REG <7:0>) and outputs 2 data signals (e.g., out_mux_A, out_mux_B). The data signals remain as input in the multiplexer 600 for the time period of the master clock signal (e.g., 48 ns). The select lines (e.g., C<3:0>) received from a shift register provide the addresses of the multiplexer 600 as illustrated in the following table.

| C0 | C1 | C2 | C3 | OUTA | OUTB |
| --- | --- | --- | --- | --- | --- |
| 1 | 0 | 0 | 0 | DL_REG(0) | DL_REG(1) |
| 0 | 1 | 0 | 0 | DL_REG(2) | DL_REG(3) |
| 0 | 0 | 1 | 0 | DL_REG(4) | DL_REG(5) |
| 0 | 0 | 0 | 1 | DL_REG(6) | DL_REG(7) |

Figure 7:
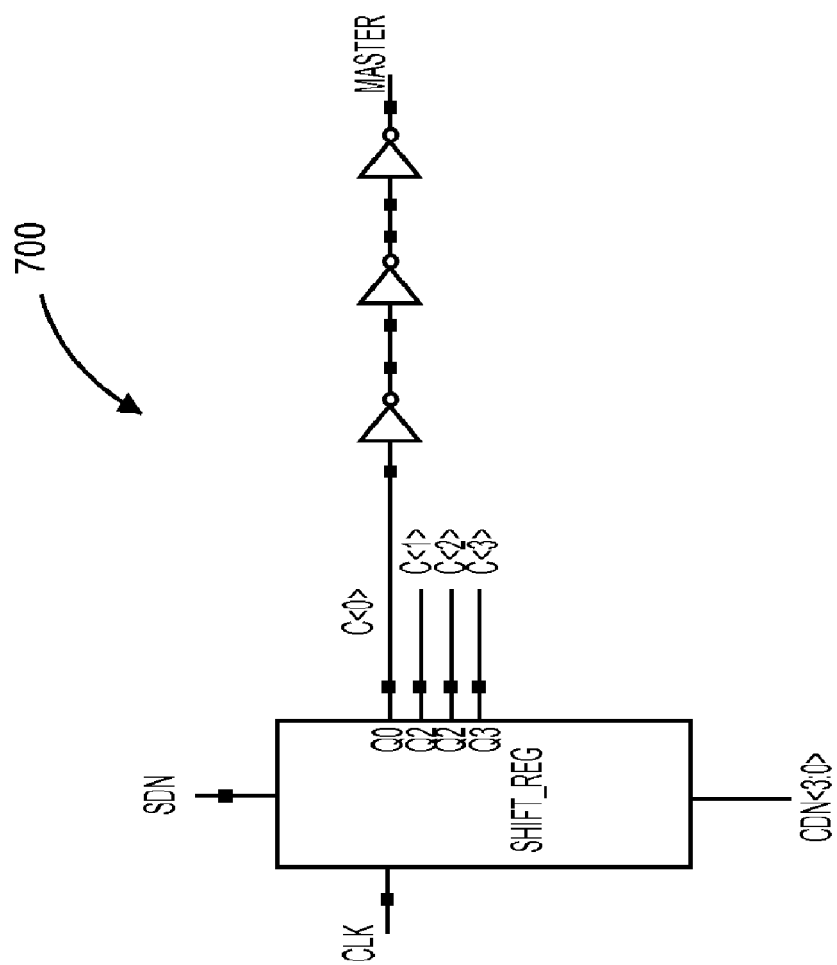
FIG. 7 illustrates a shift register in accordance with one embodiment.

FIG. 7 illustrates a shift register in accordance with one embodiment. The select lines (e.g., C<0>, C<1>, C<2>, C<3>) received from the shift register 700 provide the addresses of the multiplexer 600 while the master signal is the clock signal of the master-slave data storage unit 500. The shift register 700 has an input clock signal (e.g., 12 ns time period). The shift register 700 has control signals CDN and SDN. For a preset operation, CDN<3:0>=0001 and SDN=0. For a reset operation, CDN<3:0>=0000 and SDN is a don't care condition. For a shift operation, CDN<3:0>=1111 and SDN=1.

Figure 8:
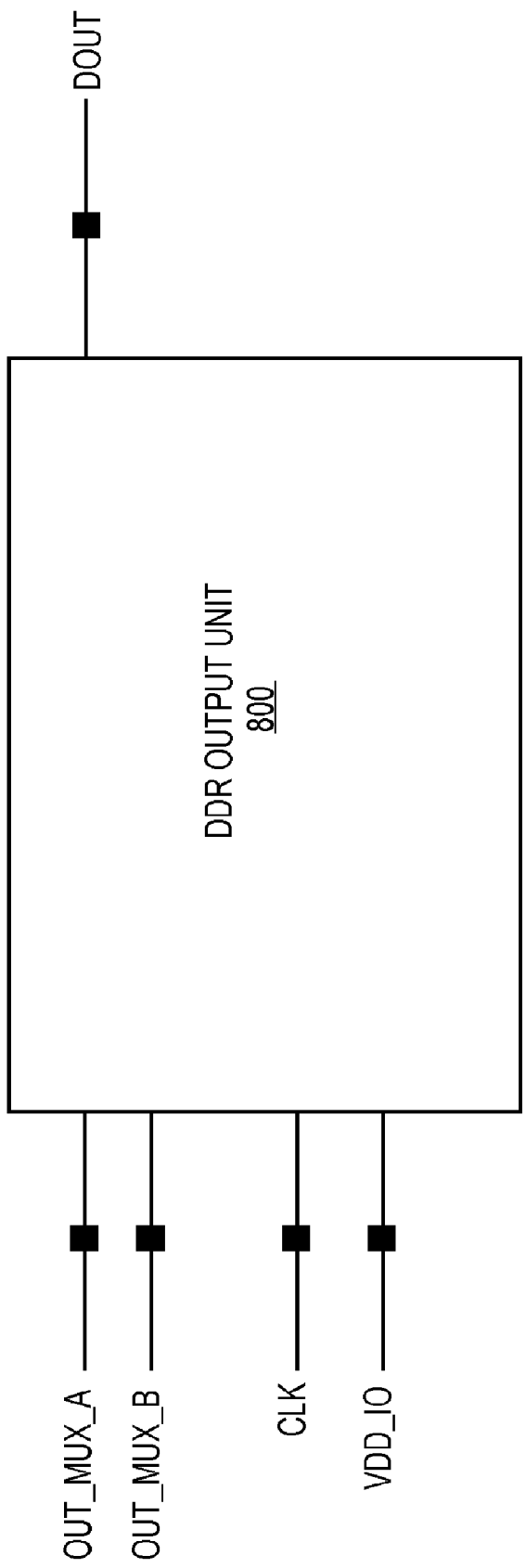
FIG. 8 illustrates a DDR output unit in accordance with one embodiment.

FIG. 8 illustrates a DDR output unit in accordance with one embodiment. The DDR output unit 800 has input data signals, OUT_MUX_A and OUT_MUX_B, a clock signal, a voltage supply VDD IO (e.g., 2.4V), and an output signal DOUT. The DDR output unit 800 receives two data signals every clock period T (e.g., 12 ns) and outputs the same data signal at half the clock period T/2 (e.g., 6 ns) to realize a double data rate.

Figure 9:
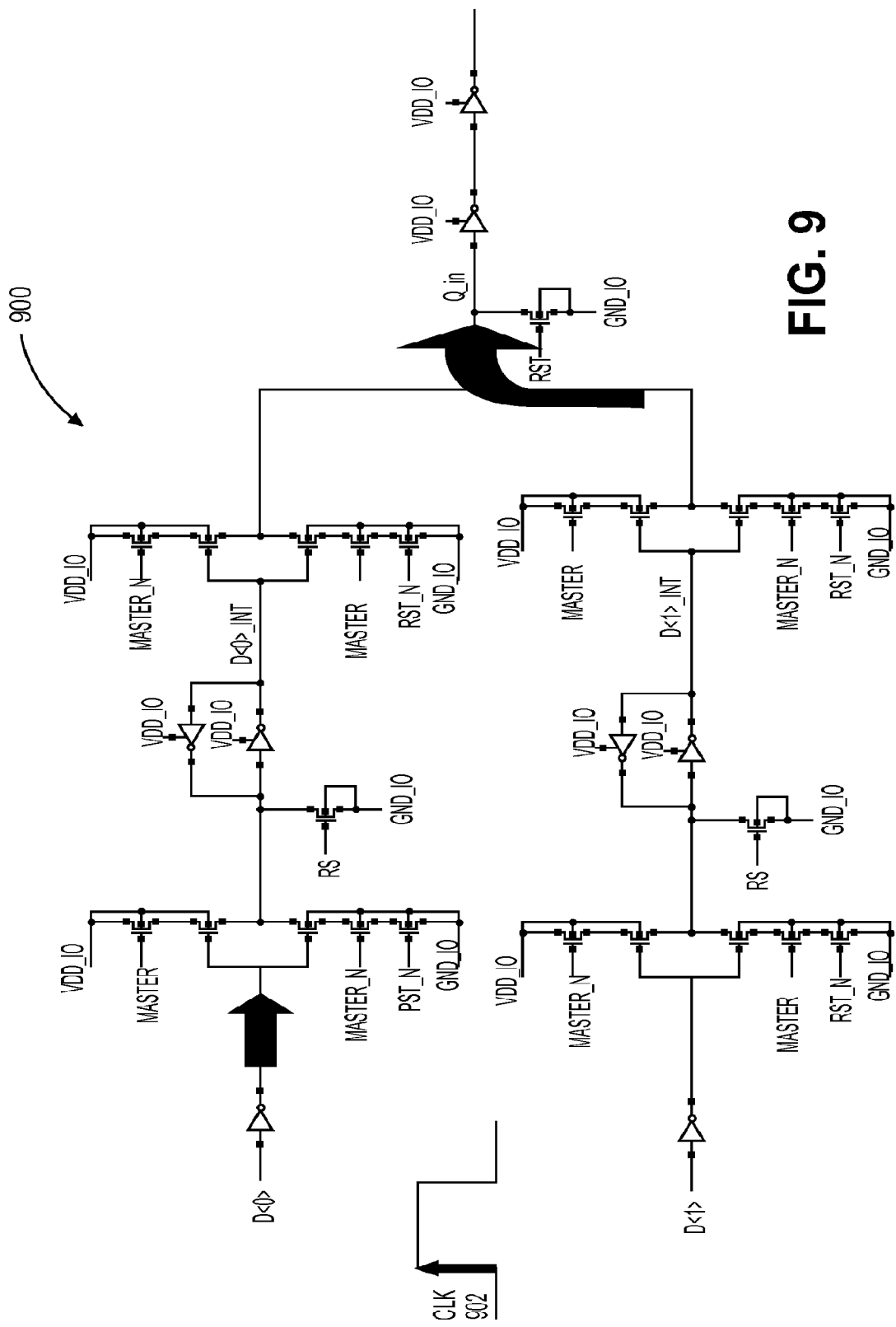
FIG. 9 illustrates a DDR output unit transferring data on a rising edge clock signal in accordance with one embodiment.

FIG. 9 illustrates a DDR output unit transferring data on a rising edge clock signal in accordance with one embodiment. The DDR output unit 900 includes two parallel master-slave registers. At the same rising edge clock signal 902, the top master-slave register receives input from D<0> and simultaneously the bottom master-slayer register transfers a previously stored D<1> initial value. The DDR output unit 900 includes transistors and inverters. The inverters are coupled to VDD IO. The transistors may be coupled to VDD IO or ground (GND IO). The transistors receive input signals (e.g., D<0>, D<0>INT, D<1>, D<1>INT, master, master N, PST N, RS, RST N, RST. The inverters near an output of the DDR output unit 900 receive a Q in signal.

Figure 10:
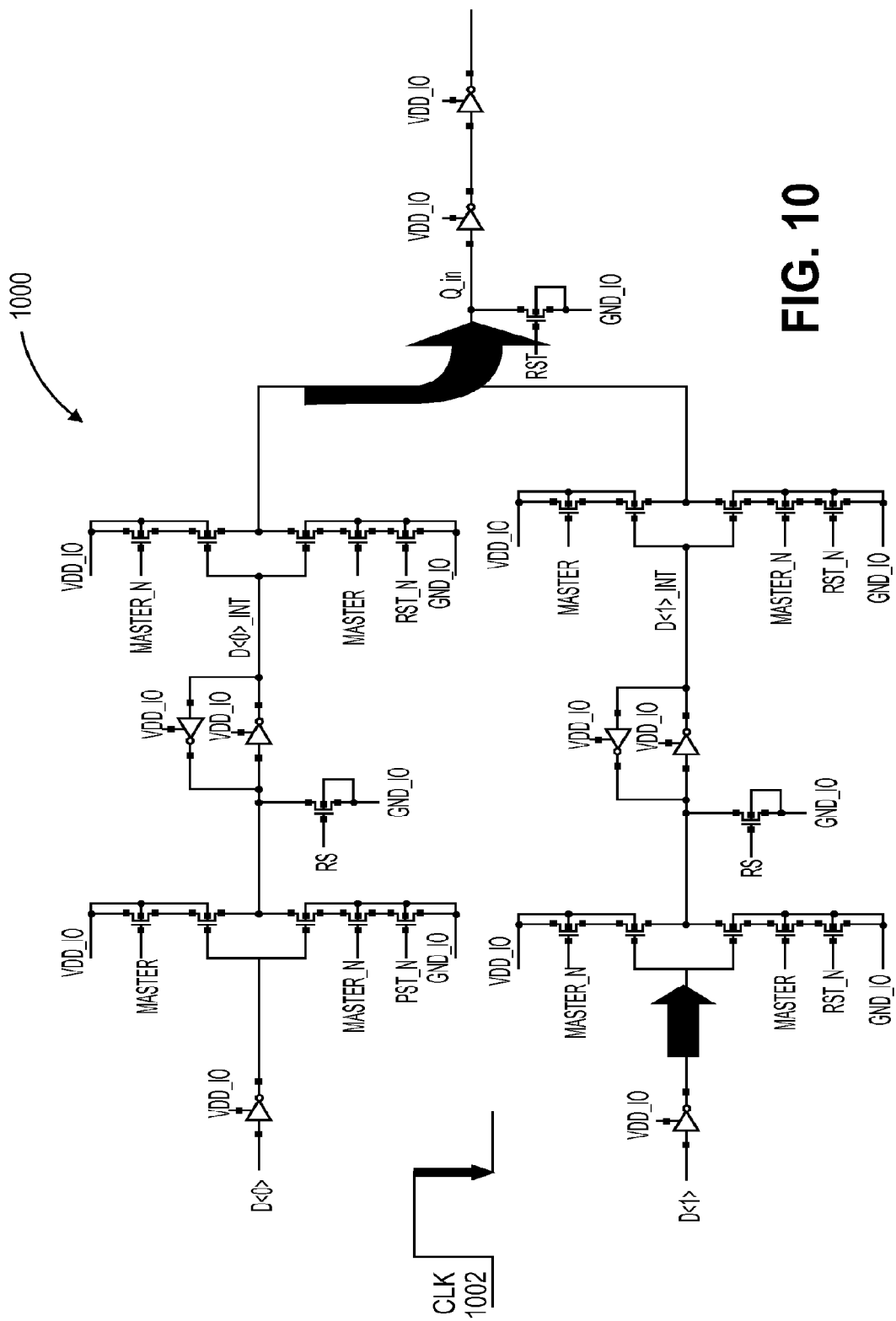
FIG. 10 illustrates the DDR output unit 900 transferring data on a falling edge clock signal in accordance with one embodiment.

FIG. 10 illustrates the DDR output unit 900 transferring data on a falling edge clock signal in accordance with one embodiment. The DDR output unit 1000 includes two parallel master-slave registers. At the same falling edge clock signal 1004, the bottom master-slave register receives input from D<1> and simultaneously the top master-slayer register transfers a previously stored D<0> initial value. Thus, two data input signals can be transferred with a single clock time period. The DDR output unit 1000 includes transistors and inverters. The inverters are coupled to VDD IO. The transistors may be coupled to VDD IO or ground (GND IO). The transistors receive input signals (e.g., D<0>, D<0>INT, D<1>, D<1>INT, master, master N, PST N, RS, RST N, RST. The inverters near an output of the DDR output unit 1000 receive a Q in signal.

Figure 11:
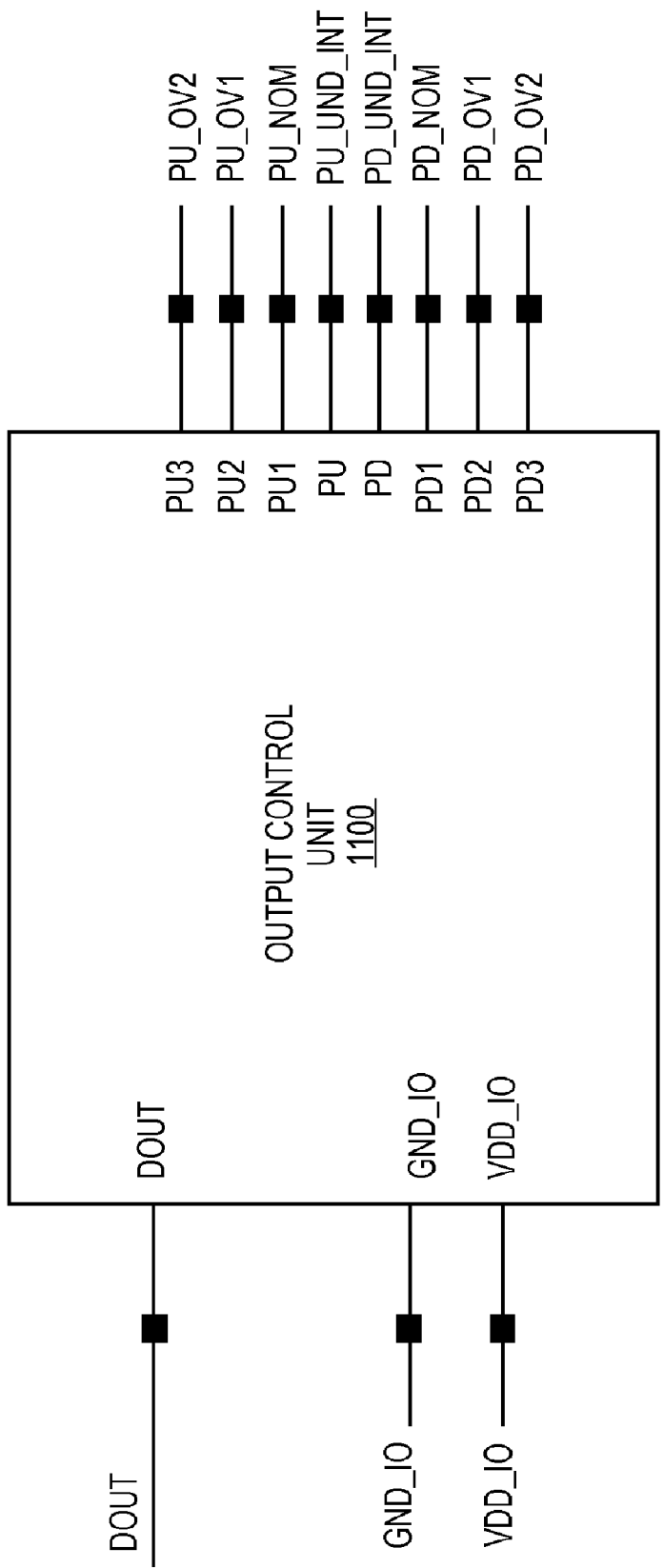
FIG. 11 illustrates an output control unit in accordance with one embodiment.
Figure 14:
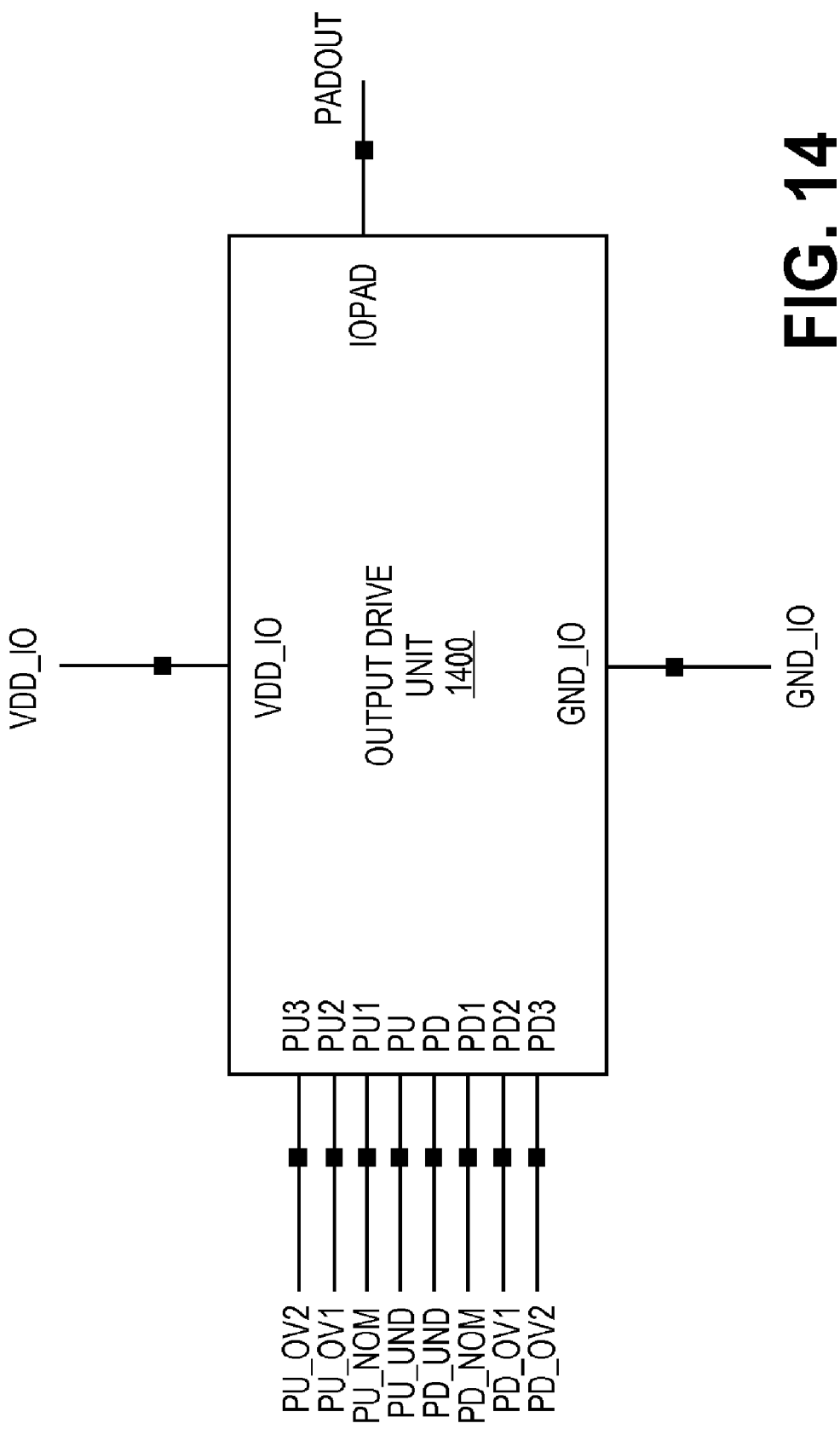
FIG. 14 illustrates an output drive unit in accordance with one embodiment.
Figure 15:
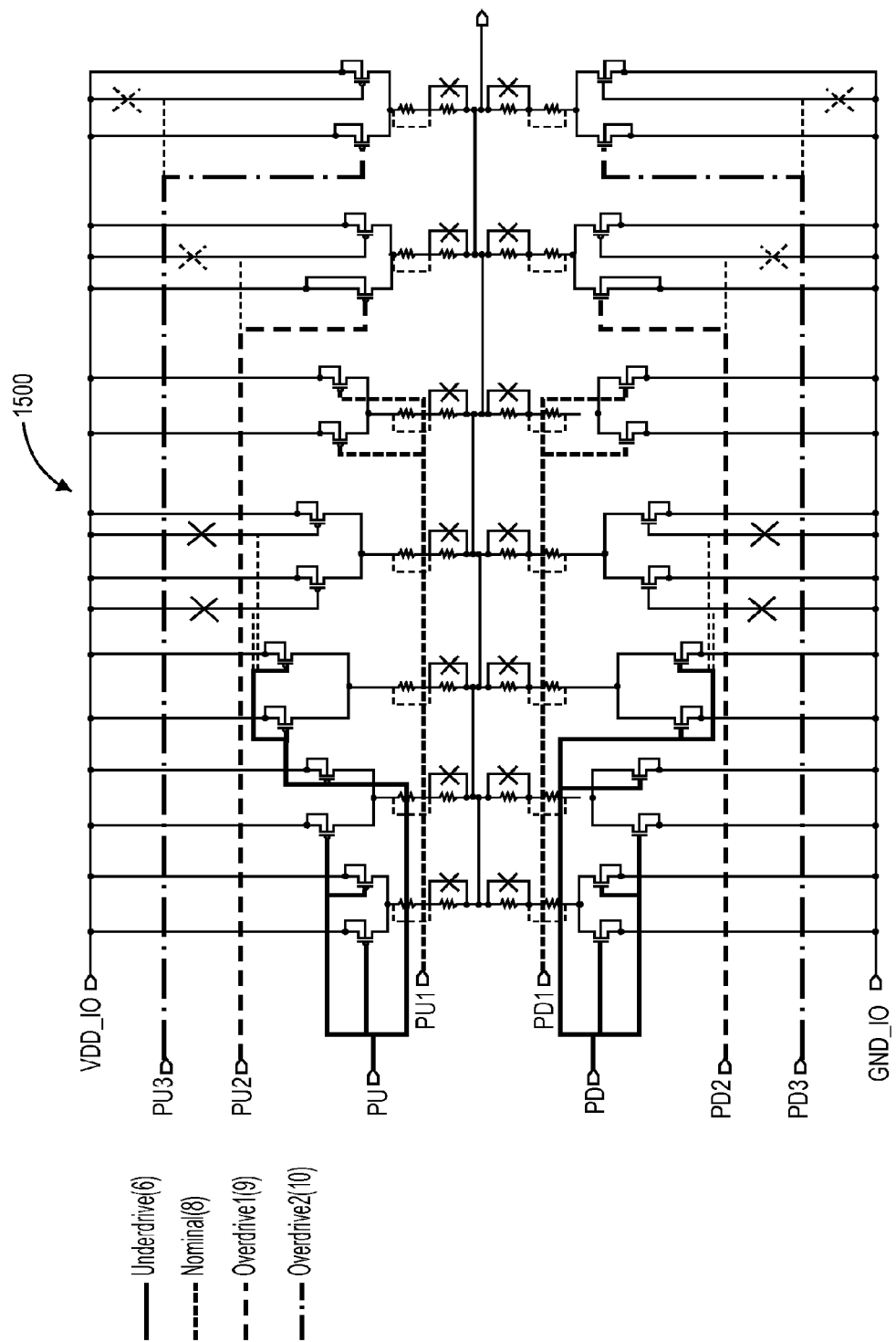
FIG. 15 illustrates an output control unit in accordance with some embodiments.

FIG. 11 illustrates an output control unit in accordance with one embodiment. The output control unit 1100 receives the DOUT signal from the DDR output unit 800 and generates control signals (e.g., PU_OV2, PU_OV1, PU_NOM, PU_UND_INT, PD_OV2, PD_OV1, PD_NOM, and PD_UND_INT) that drive pull-up and pull-down transistors (e.g., PU3, PU2, PU1, PU, PD, PD1, PD2, PD3) in an output drive unit as illustrated in FIG. 14 and FIG. 15. The output control unit 1100 has a supply voltage VDD IO (e.g., 2.4V) and receives DDR input data once every half clock time period T/2 (e.g., 6 ns). The output control unit 1100 is coupled to ground (GND IO) and VDD IO.

Figure 12:
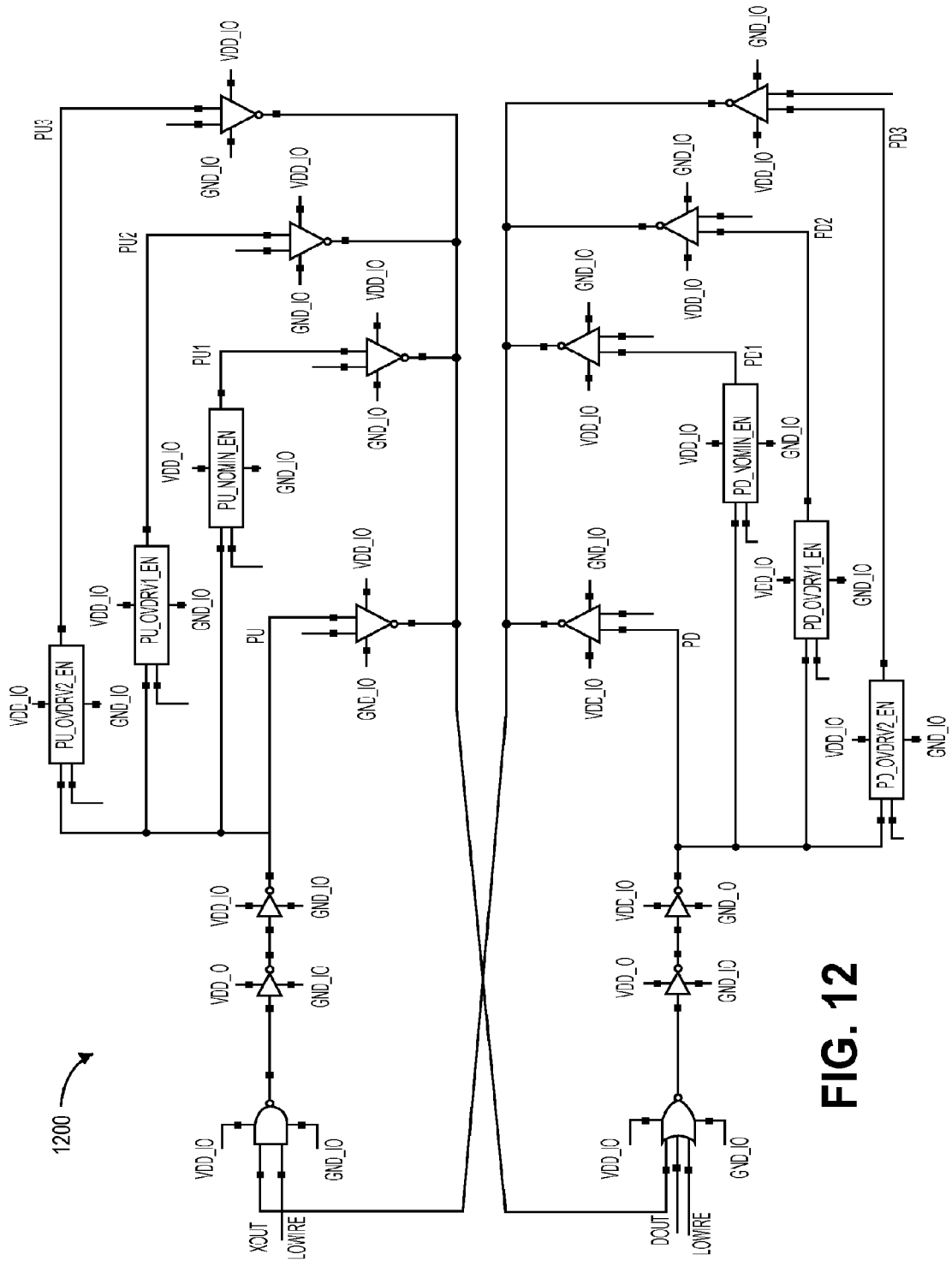
FIG. 12 illustrates an output control unit in accordance with another embodiment.

FIG. 12 illustrates an output control unit in accordance with another embodiment. The output control unit 1200 determines one of the following working conditions in order to alter the slew rate of an output drive unit: underdrive, nominal, overdrive 1, and overdrive 2. The control signals (e.g., PU_OV2, PU_OV1, PU_NOM, PU_UND_INT, PD_OV2, PD_OV1, PD_NOM, and PD_UND_INT) generated by the output control unit 1100 determine the appropriate working condition of the output drive unit. Blocks PD OVDRV2 EN, PD OVDRV1 EN, PD NOMIN EN, PU NOMIN EN, PU OVDRV1 EN, PU OVDRV2 EN generate the control signals. For an underdrive working condition, a pair of underdrive PMOS and NMOS transistors (e.g., PU, PD) are enabled only as illustrated in FIG. 15. For a nominal working condition, an additional pair of PMOS and NMOS transistors (e.g., PU1, PD1) are enabled. For overdrive 1 and overdrive 2 working conditions, additional pair(s) of PMOS and NMOS transistors (e.g., PU1, PD1, PU2, PD2) are enabled in order to increase a slew rate as desired. The output control unit 1200 includes blocks, inverters, inverted tri-state buffers, a NAND gate, and a NOR gate with each component being coupled to VDD IO and GND IO. The NAND gate receives XOUT and LOWIRE inputs while the NOR gate receives DOUT and LOWIRE inputs.

Figure 13:
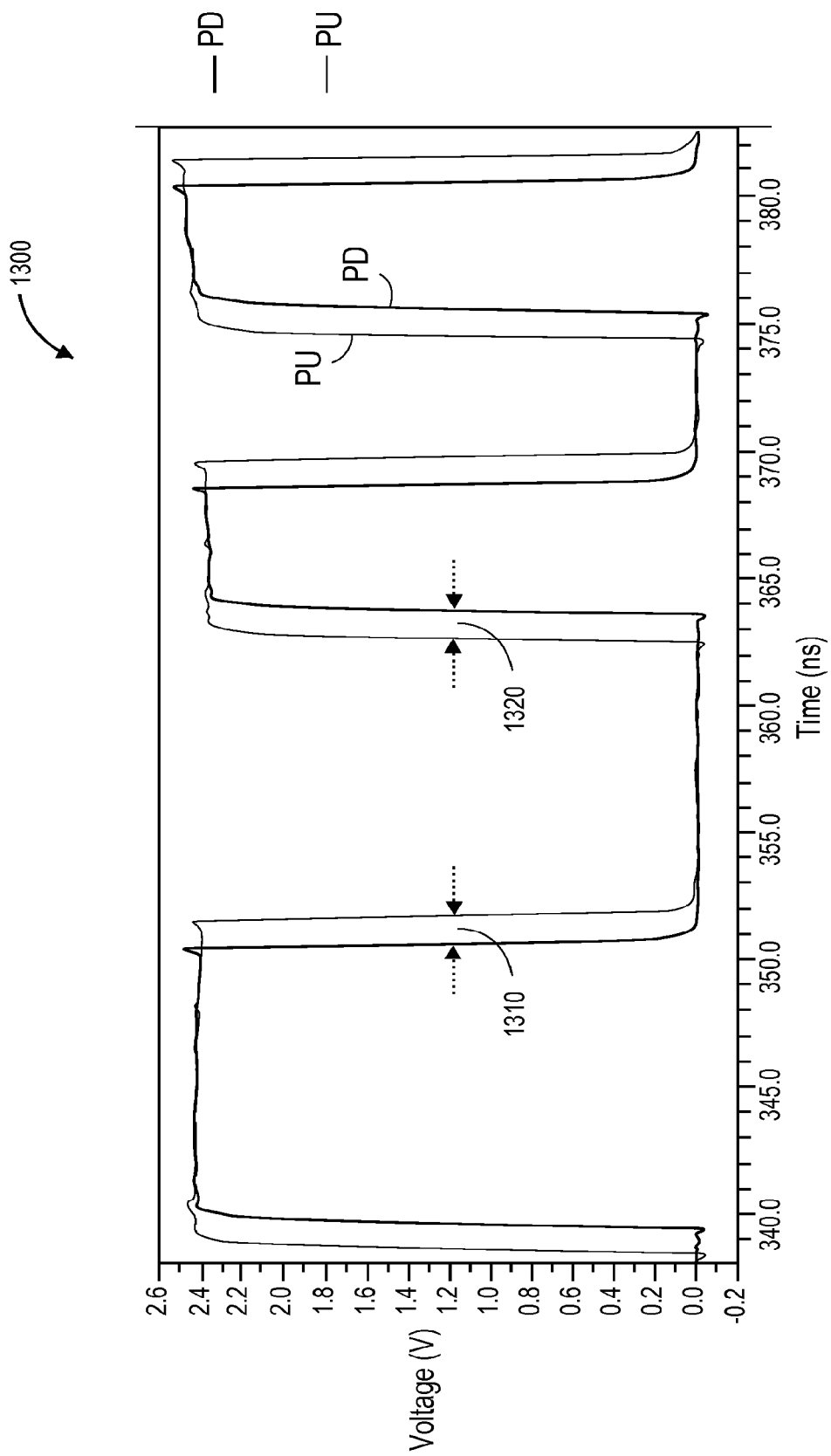
FIG. 13 illustrates enable signals generated by an output control unit in accordance with one embodiment.

FIG. 13 illustrates a timing diagram for control enable signals generated by the output control unit 1200 in accordance with one embodiment. The timing diagram 1300 illustrates voltage versus time in nanoseconds (ns) including a disoverlap, time delay, between pull-up (PU) and pull-down (PD) enable signals. An amount of disoverlap, time delay (1310, 1320), is designed in accordance with a programmable drive strength of each output driver of a coupled output drive unit. The disoverlap is useful to limit short circuit currents in the driver unit.

FIG. 14 illustrates an output drive unit in accordance with one embodiment. The output drive unit 1400 receives control signals (e.g., PU_OV2, PU_OV1, PU_NOM, PU_UND, PD_OV2, PD_OV1, PD_NOM, and PD_UND) generated by the output control unit 1100. The output drive unit 1400 drives an output load using PCH pull-up and NCH pull-down transistors (e.g., PU3, PU2, PU1, PU, PD, PD1, PD2, PD3). The output drive unit 1400 has a supply voltage VDD IO (e.g., 1.8V), GND IO terminal, and IOPAD padout signal.

FIG. 15 illustrates an output control unit in accordance with some embodiments. For an underdrive working condition, the first three pairs of PMOS and NMOS transistors (PU, PD) are enabled as illustrated in FIG. 15. For a nominal working condition, an additional pair of PMOS and NMOS transistors (PU1, PD1) are enabled. For overdrive 1 and overdrive 2 working conditions, additional pair(s) of PMOS and NMOS transistors (e.g., PU2, PD2, PU3, PD3) are enabled in order to increase a slew rate as desired. The output control unit 1500 is coupled to VDD IO and GND IO.

Figure 16:
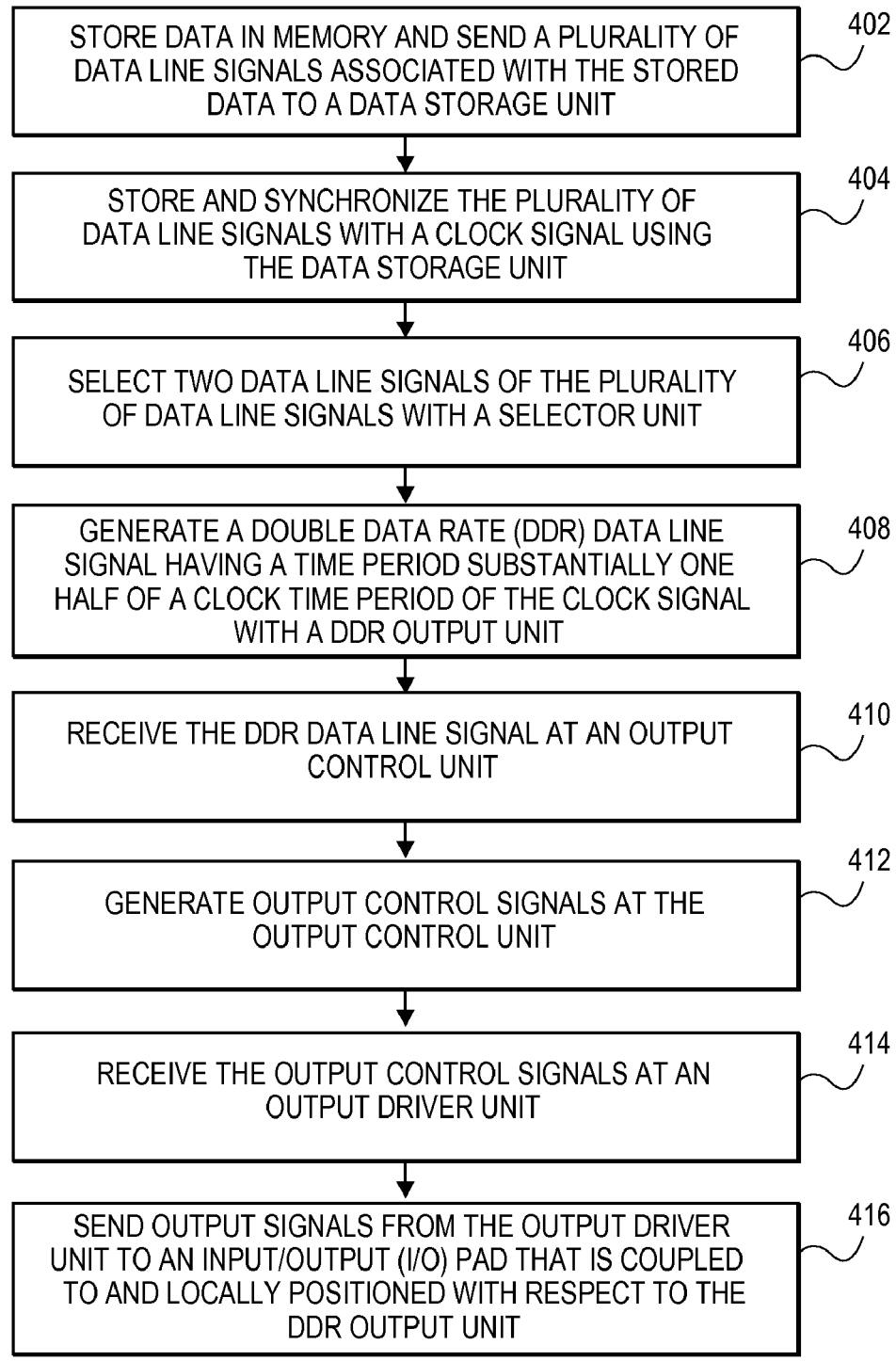
FIG. 16 illustrates a method for providing a DDR memory access in accordance with one embodiment.

FIG. 16 illustrates a method for managing a DDR memory access in accordance with one embodiment. The method includes storing data in memory and sending a plurality of data line signals associated with the stored data to a data storage unit at block 402. Next, the method includes storing and synchronizing the plurality of data line signals with a clock signal using the data storage unit at block 404. Next, the method includes selecting two data line signals of the plurality of data line signals with a selector unit at block 406. Next, the method includes generating a double data rate (DDR) data line signal having a time period substantially one half of a clock time period of the clock signal with a DDR output unit at block 408. Next, the method includes receiving the DDR data line signal at an output control unit at block 410. Next, the method includes generating output control signals at the output control unit at block 412. Next, the method includes receiving the output control signals at an output driver unit at block 414. Next, the method includes sending output signals from the output driver unit to an input/output (I/O) pad that is coupled to and locally positioned with respect to the DDR output unit at block 416. The data storage unit, the selector unit, and the DDR output unit in combination form an I/O buffer which is locally coupled to or enclosed within the I/O pad. The I/O buffer provides the synchronization of the DDR data line signal with the clocking signal while being locally positioned with respect to the I/O pad.

Some portions of the detailed description are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. An apparatus may be specially constructed for the desired purposes, or it may comprise a general purpose computing device selectively activated or reconfigured by a program stored in the device. Such a program may be stored on a storage medium, such as, but not limited to, any type of disk including floppy disks, optical disks, compact disc read only memories (CD-ROMs), magnetic-optical disks, read-only memories (ROMs), random access memories (RAMs), electrically programmable read-only memories (EPROMs), electrically erasable and programmable read only memories (EEPROMs), magnetic or optical cards, or any other type of media suitable for storing electronic instructions, and capable of being coupled to a system bus for a computing device.

The processes and displays presented herein are not inherently related to any particular computing device or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the invention as described herein. In addition, it should be understood that operations, capabilities, and features described herein may be implemented with any combination of hardware (discrete or integrated circuits) and software.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g. as in a cause an effect relationship).

In the above detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention. It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. An apparatus, comprising:
   a data storage unit to store and synchronize a plurality of data line signals with a clock signal;
   a selector unit coupled to the data storage unit, the selector unit to receive the plurality of data line signals and to select two data line signals;
   a double data rate (DDR) output unit to receive the two data line signals from the selector unit and to generate a DDR data line signal having a time period substantially one half of a clock time period of the clock signal; and an input/output (I/O) pad coupled to and locally positioned with respect to the DDR output unit.

2. The apparatus of claim 1, wherein the data storage unit, the selector unit, and the DDR output unit in combination form an I/O buffer which is enclosed within the I/O pad, the I/O buffer provides the synchronization of the DDR data line signal with the clocking signal while being locally positioned with respect to the I/O pad.

3. The apparatus of claim 2, wherein the I/O buffer further comprises an output control unit coupled to the DDR output unit, the output control unit to receive the DDR data line signal and to generate output control signals.

4. The apparatus of claim 3, wherein the I/O buffer further comprises an output drive unit coupled to the output control unit, the output drive unit to receive the output control signals and to generate output signals that are sent to the I/O pad.

5. The apparatus of claim 4, wherein the clock time period is approximately less than or equal to 12 nanoseconds and the time period of the DDR data line signal is approximately less than or equal to 6 nanoseconds.

6. The apparatus of claim 2, further comprising:
memory coupled to the I/O buffer, the memory to store data associated with the plurality of data line signals.

7. The apparatus of claim 1, wherein the I/O buffer further comprises a voltage multiplier unit coupled to the DDR output unit and the output control unit, the voltage multiplier unit to receive a first voltage supply and to generate a second voltage supply that is greater than the first voltage supply.

8. A data processing device, comprising:
a processing unit having first and second processor cores; and
system memory coupled to the processing unit, the system memory having an integrated circuit device comprising
a data storage unit to store and synchronize a plurality of data line signals with a clock signal;
a selector unit coupled to the data storage unit, the selector unit to receive the plurality of data line signals and to select two data line signals;
a double data rate (DDR) output unit to receive the two data line signals from the selector unit and to generate a DDR data line signal having a time period substantially one half of a clock time period of the clock signal; and
an input/output (I/O) pad coupled to and locally positioned with respect to the DDR output unit.

9. The data processing device of claim 8, wherein the data storage unit, the selector unit, and the DDR output unit in combination form an I/O buffer which is locally coupled to the I/O pad, the I/O buffer provides the synchronization of the DDR data line signal with the clocking signal while being locally positioned with respect to the I/O pad.

10. The data processing device of claim 8, wherein the clock time period is approximately less than or equal to 12 nanoseconds and the time period of the DDR data line signal is approximately less than or equal to 6 nanoseconds.

11. The data processing device of claim 9, wherein the integrated circuit device further comprises memory coupled to the I/O buffer, the memory to store data associated with the plurality of data line signals and provide a synchronous burst-read mode at approximately greater than or equal to 200 mega transfers per second.

12. The data processing device of claim 8, wherein the plurality of data line signals comprise eight data line signals.

13. The data processing device of claim 8, wherein the data processing device is a wireless data processing device further comprising:
a transceiver coupled to the processing unit, the transceiver to receive over-the-air signals.

14. A method, comprising:
storing and synchronizing a plurality of data line signals with a clock signal using a data storage unit;
selecting two data line signals of the plurality of data line signals with a selector unit;
generating a double data rate (DDR) data line signal having a time period substantially one half of a clock time period of the clock signal with a DDR output unit; and
sending output signals based on the DDR data line signal to an input/output (I/O) pad that is coupled to and locally positioned with respect to the DDR output unit.

15. The method of claim 1, wherein the data storage unit, the selector unit, and the DDR output unit in combination form an I/O buffer which is locally coupled to the I/O pad, the I/O buffer provides the synchronization of the DDR data line signal with the clocking signal while being locally positioned with respect to the I/O pad.

16. The method of claim 14, further comprising:
receiving the DDR data line signal at an output control unit; and
generating output control signals at the output control unit.

17. The method of claim 16, further comprising:
receive the output control signals at an output drive unit; and
generating output signals at the output drive unit that are sent to the I/O pad.

18. The method of claim 14, further comprising:
storing data in memory;
sending the plurality of data line signals associated with the stored data to the data storage unit.

19. The method of claim 14, wherein the plurality of data line signals comprise eight data line signals.

* * * * *

UNITED STATES PATENT AND TRADEMARK OFFICE
CERTIFICATE OF CORRECTION

PATENT NO. : 7,995,365 B1  
APPLICATION NO. : 12/434600  
DATED : August 9, 2011  
INVENTOR(S) : Elio D'Ambrosio et al.

It is certified that error appears in the above-identified patent and that said Letters Patent is hereby corrected as shown below:

On the title page, in item (56), under "Other Publications", in column 2, line 8, delete "Industires" and insert -- Industries --, therefor.

Signed and Sealed this  
Fourteenth Day of May, 2013

Teresa Stanek Rea  
*Acting Director of the United States Patent and Trademark Office*